US012518689B2

(12) United States Patent
Zhou et al.

(10) Patent No.: US 12,518,689 B2
(45) Date of Patent: Jan. 6, 2026

(54) DISPLAY PANEL, DRIVING METHOD OF DISPLAY PANEL, AND DISPLAY DEVICE

(71) Applicant: HKC CORPORATION LIMITED, Shenzhen (CN)

(72) Inventors: Luhong Zhou, Shenzhen (CN); Ruidi Ran, Shenzhen (CN); Junfeng Xie, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 18/916,711

(22) Filed: Oct. 16, 2024

(65) Prior Publication Data

US 2025/0131871 A1    Apr. 24, 2025

(30) Foreign Application Priority Data

Oct. 18, 2023   (CN) .......................... 202311345685.9

(51) Int. Cl.
   *G09G 3/32* (2016.01)
   *H01L 25/16* (2023.01)

(52) U.S. Cl.
   CPC ........... *G09G 3/32* (2013.01); *G09G 2310/08* (2013.01); *G09G 2320/0242* (2013.01); *G09G 2320/041* (2013.01); *G09G 2320/045* (2013.01); *G09G 2330/12* (2013.01); *H01L 25/167* (2013.01)

(58) Field of Classification Search
   CPC ................. G09G 3/32; G09G 2310/08; G09G 2320/0242; G09G 2320/041; G09G 2320/045; G09G 2330/12; H01L 25/167
   See application file for complete search history.

(56) References Cited

U.S. PATENT DOCUMENTS

2020/0349901 A1*  11/2020  Kong .................... G09G 3/3611
2025/0265972 A1*   8/2025  Lee ....................... G09G 3/3275

FOREIGN PATENT DOCUMENTS

| CN | 1495695 A | | 5/2004 | |
| CN | 105528991 A | * | 4/2016 | ............... G09G 3/32 |
| CN | 205751478 U | | 11/2016 | |
| CN | 112331116 A | * | 2/2021 | ............. G09G 3/006 |
| CN | 116416928 A | | 7/2023 | |

* cited by examiner

*Primary Examiner* — Ke Xiao
*Assistant Examiner* — Jennifer L Zubajlo

(57) ABSTRACT

A display panel includes a first row driving module, a second row driving module, and a control module. The first row driving module is arranged on one side of the base plate, and includes a first row transistor column and a first decoder that are connected. Multiple first pins are arranged on the first row transistor column, and are each connected to a respective row of LEDs. The second row driving module is arranged on the other side of the base plate, and includes a second row transistor column and a first decoder that are connected. Multiple second pins are arranged on the second row transistor column, and are each connected to a respective row of LEDs. The control module is connected to the first and the second row driving module, and controls one of the first and the second decoder to operate or both to operate simultaneously.

18 Claims, 5 Drawing Sheets

DISPLAY PANEL, DRIVING METHOD OF DISPLAY PANEL, AND DISPLAY DEVICE

CROSS-REFERENCE TO RELATED APPLICATIONS

This application claims the priority and benefit of Chinese patent application number 2023113456859, titled "Display Panel, Driving Method of Display Panel, and Display Device" and filed Oct. 18, 2023 with China National Intellectual Property Administration, the entire contents of which are incorporated herein by reference.

TECHNICAL FIELD

This application relates to the field of display technology, and more particularly relates to a display panel, a driving method of the display panel, and a display device.

BACKGROUND

The description provided in this section is intended for the mere purpose of providing background information related to the present application but doesn't necessarily constitute prior art.

In Micro-LED, Mini-LED, and LED display screens, the driving method may adopt scan driving, including a row driving module and a column driving module. The row driving module may perform driving using row transistors, and multiple field effect transistors may be integrated inside a row transistor. One field effect transistor is used to drive dozens or even hundreds of LED light-emitting elements. During the driving process, depending on the number of light-emitting elements driven by the field effect transistor, the driving current of the field effect transistor will vary from hundreds of milliamperes to several amperes. If the load current of each field effect transistor is too large and the row transistor works continuously for a long time, the row transistor will generate serious heat, causing the temperature in the display panel to rise, thereby affecting the light-emitting efficiency of the LED light-emitting element and causing the color temperature to shift. In addition, the LED light-emitting element and the row transistor are both semiconductor devices. Excessively high temperature will affect the service life of the LED light-emitting element and the row transistor. Therefore, it is very important to solve the problem of excessively high temperature of the row transistor when the LED display screen is in use.

SUMMARY

It is therefore a purpose of the present application to provide a display panel, a driving method of the display panel, and a display device, so as to solve the problem of excessive temperature of the row transistors when the LED display screen is in use by setting a control module.

The present application discloses a display panel, including a base plate and a plurality of LED light-emitting elements. The plurality of LED light-emitting elements are arranged in an array on the base plate. The display panel further includes a first row driving module, a second row driving module, and a control module. The first row driving module is arranged on one side of the base plate. The first row driving module includes a first row transistor column and a first decoder connected to the first row transistor column. A plurality of first pins are arranged on the first row transistor column. Each first pin is connected to a respective row of the LED light-emitting elements. The second row driving module is arranged on the other side of the base plate. The second row driving module includes a second row transistor column and a first decoder connected to the second row transistor column. A plurality of second pins are arranged on the second row transistor column. Each second pin is connected to a respective row of the LED light-emitting elements. The control module is connected to the first row driving module and the second row driving module. The control module is used to control one of the first decoder and the second decoder to operate or to control both to operate simultaneously.

In some embodiments, the control module includes a switch. The first decoder includes a first enable pin. The second decoder includes a second enable pin. One end of the switch is connected to the first enable pin, and the other end is connected to the second enable pin, for controlling the operation of the first decoder and the second decoder.

In some embodiments, the control module further includes an inverter. One end of the inverter is connected to the first enable pin, and the other end is connected to the second enable pin. The inverter is arranged in parallel with the switch.

In some embodiments, the control module further includes a control unit and a control switch. The first decoder includes a first input pin and a first output pin. The second decoder includes a second input pin and a second output pin. The input terminal of the control switch is connected to the control unit. The output terminal of the control switch is connected to the first input pin or the second input pin. The first output pin is connected to the first row transistor column, and the second output pin is connected to the second row transistor column. The control unit switches to connect to the first decoder or to connect to the second decoder through the control switch.

In some embodiments, the display panel further includes a first detection module. The first detection module is connected to the first row transistor column and the switch to detect the output signal of the first pin. When the output signal of the first pin is abnormal, the first detection module controls the switch to be turned on.

In some embodiments, the display panel further includes a second detection module. The second detection module is connected to the first decoder and the switch to detect the output signal of the first decoder. When the output signal of the first decoder is abnormal, the second detection module controls the switch to be turned on.

The present application further discloses a display panel driving method, which is applied to the display panel as described above, and includes the following operations:
 detecting whether an output signal of the first row transistor column reaches a threshold value; and
 controlling the control module according to the detection result;
 wherein when the detection result reaches the threshold value, the control module controlling the first decoder and the second decoder to operate simultaneously; when the detection result does not reach the threshold value, the control module controlling one of the first decoder and the second decoder to operate.

In some embodiments, the operation of controlling the control module according to the detection result includes:
 when the detection result is greater than the threshold value, the control module controlling the switch to be closed, so that the first decoder and the second decoder work simultaneously, until the detection result is less than the threshold value, the control module controlling the switch to be opened, so that one of the first decoder and the second decoder works;

wherein the threshold value is a rated value of the first row transistor column.

In some embodiments, the operation of controlling the control module according to the detection result includes:

when the detection result is continuously zero, it is determined that the first decoder is working abnormally, and the control module controlling the switch to be closed, so that the first decoder and the second decoder work simultaneously.

The present application further discloses a display device, including a driving circuit and the display panel as described above, wherein the driving circuit is configured to the display panel.

The display panel of the present application can detect whether the output signal of the first row transistor column reaches the threshold value, and decide to let whether one of the first row transistor column and the second row transistor column work or let both work together, so that the operating temperature of the display panel can be stably controlled during operation, avoiding the problem of temperature rise of the display panel due to the use of a single row transistor, which may affect the light-emitting efficiency and causes color temperature deviation of the LED light-emitting elements. Thus, the high-temperature heat source in the display panel is dispersed and the high-temperature heat source value is reduced, thereby improving the service life of the row transistor and the LED light-emitting elements, and thus extending the service life of the display panel.

BRIEF DESCRIPTION OF DRAWINGS

The accompanying drawings are used to provide a further understanding of the embodiments according to the present application, and constitute a part of the specification. They are used to illustrate the embodiments according to the present application, and explain the principle of the present application in conjunction with the text description. Apparently, the drawings in the following description merely represent some embodiments of the present disclosure, and for those having ordinary skill in the art, other drawings may also be obtained based on these drawings without investing creative efforts. Hereinafter the present application will be described in detail with reference to the accompanying drawings and optional embodiments.

Figure 1:
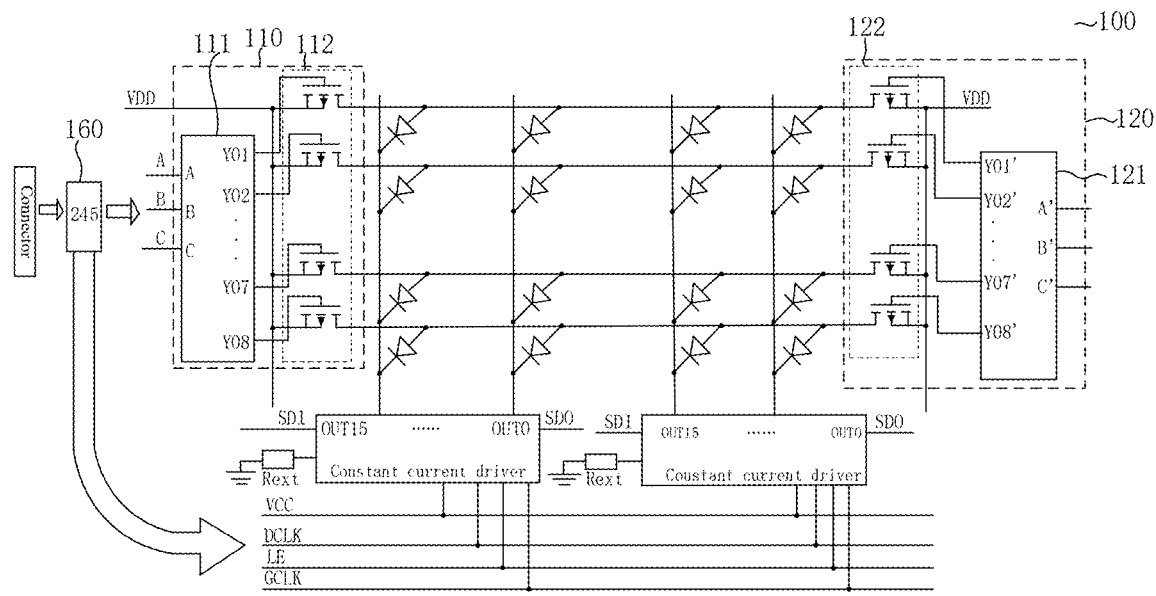
FIG. 1 is a schematic diagram illustrating the structure of a display panel according to a first embodiment of the present application.

In the drawings: 100, display panel; 110, first row driving module; 111, first decoder; 112, first row transistor column; 120, second row driving module; 121, second decoder; 122, second row transistor column; 130, control module; 131, control unit; 140, first detection module; 150, second detection module; 160, signal enhancement module; 200, driving circuit; 300, display device.

DETAILED DESCRIPTION OF EMBODIMENTS

It should be understood that the terms used herein, the specific structures and function details disclosed herein are intended for the mere purposes of describing specific embodiments and are representative. However, this application may be implemented in many alternative forms and should not be construed as being limited to the embodiments set forth herein.

As used herein, terms "first", "second", or the like are merely used for illustrative purposes, and shall not be construed as indicating relative importance or implicitly indicating the number of technical features specified. Thus, unless otherwise specified, the features defined by "first" and "second" may explicitly or implicitly include one or more of such features. Terms "multiple", "a plurality of", and the like mean two or more. Term "comprising", "including", and any variants thereof mean non-exclusive inclusion, so that one or more other features, integers, steps, operations, units, components, and/or combinations thereof may be present or added.

In addition, terms "center", "transverse", "up", "down", "left", "right", "vertical", "horizontal", "top", "bottom", "inside", "outside", or the like are used to indicate orientational or relative positional relationships based on those illustrated in the drawings. They are merely intended for simplifying the description of the present disclosure, rather than indicating or implying that the device or element referred to must have a particular orientation or be constructed and operate in a particular orientation. Therefore, these terms are not to be construed as restricting the present disclosure.

Furthermore, as used herein, terms "installed on", "mounted on", "connected to", "coupled to", "connected with", and "coupled with" should be understood in a broad sense unless otherwise specified and defined. For example, they may indicate a fixed connection, a detachable connection, or an integral connection. They may denote a mechanical connection, or an electrical connection. They may denote a direct connection, a connection through an intermediate, or an internal connection between two elements. For those of ordinary skill in the art, the specific meanings of the above terms as used in the present application can be understood depending on specific contexts.

The present application will be described in detail below with reference to the accompanying drawings and optional embodiments. It should be noted that, should no conflict is present, the various embodiments or technical features described below can be combined arbitrarily to form new embodiments.

As shown in FIG. 1, as a first embodiment of the present application, a display panel 100 is disclosed. The display panel 100 includes a base plate, a plurality of LED light-emitting elements, a first row driving module 110, and a second row driving module 120, and a control module 130. A plurality of LED light-emitting elements are arranged in an array on the base plate. The first row driving module 110 is arranged on one side of the base plate. The first row driving module 110 includes a first row transistor column 112 and a first decoder 111 connected to the first row transistor column 112. A plurality of first pins are arranged on the first row transistor column 112. Each of the first pins is connected to a respective row of LED light-emitting elements. The second row driving module 120 is arranged on the other side of the base plate. The second row driving module 120 includes a second row transistor column 122 and a second decoder 121 connected to the second row transistor column 122. A plurality of second pins are arranged on the second row transistor column 122. Each of the second pins is connected to a respective row of LED light-emitting elements. The control module 130 is connected to the first row driving module 110 and the second row driving module 120. The control module 130 is used to control one of the first decoder 111 and the second decoder 121 to operate or control both to operate simultaneously. The first row driving module 110 and the second row driving module 120 are respectively arranged on two sides of the plurality of LED light-emitting elements that are arranged in an array. One side of a row of LED light-emitting elements is connected to a first pin of the first row transistor column 112, and the other side is connected to a second pin of the second row transistor column 122, so that the LED light-emitting elements can be driven by the first row transistor column 112 and the second row transistor column 122 alone or together.

When the display panel 100 of the present application is in use, the timing control signal is input into the first decoder 111. After being processed by the first decoder 111, the first decoder 111 controls the first row transistor column 112 so as to control the plurality of LED light-emitting elements to operate and emit light. During this process, if the output signal of the first row transistor column 112 reaches a preset threshold value during operation, the first row transistor column 112 will have an overheating problem after long-term operation. At this time, the control module 130 controls the first decoder 111 and the second decoder 121 to switch from one of them being in operation to both operating simultaneously, and the timing control signal is simultaneously input into the first decoder 111 and the second decoder 121. After being processed by the first decoder 111 and the second decoder 121, the first decoder 111 controls the first row transistor column 112 and the second decoder 121 controls the second row transistor column 122. The first row transistor column 112 and the second row transistor column 122 simultaneously or alternately control the multiple LED light-emitting elements to operate and emit light, so that the heat originally generated by only a single decoder and row transistor in operation can be dispersed to the first row transistor column 112 and the second row transistor column 122 disposed on both sides of the LED light-emitting elements. Thus, the heat of the display panel 100 will not be concentrated in the same place when operating, but will be dispersed in the first row transistor column 112 and the second row transistor column 122, and so the temperature rise of the first row transistor column 112 and the second row transistor column 122 will not be high, and the heat generation is weaker than that of using a single row transistor, thereby improving the problem of the temperature rise of the display panel 100 affecting the light-emitting efficiency of the LED light-emitting elements and causes color temperature deviation of the LED light-emitting elements. The display panel 100 of the present application can determine to let one of the first row transistor column 112 and the second row transistor column 122 operates or let both operate together by detecting whether the output signal of the first row transistor column 112 reaches the threshold value, so that the operating temperature of the display panel 100 can be stably controlled during operation, avoiding the problem of temperature rise of the display panel 100 due to the use of a single row transistor, which affects the light-emitting efficiency and causes color temperature deviation of the LED light-emitting elements. Accordingly, the high-temperature heat source in the display panel 100 is dispersed and the high-temperature heat source value is reduced, thereby improving the service life of the row transistor and the LED light-emitting element, and thus extending the service life of the display panel 100. It should be noted that in the production process of the display panel 100, the output signal of the first row transistor column 112 can be detected by an ammeter, and the output signal of the first row transistor column 112 can be compared with the preset threshold value, so as to determine whether the display panel 100 is set to one of the first row transistor column 112 and the second row transistor column 122 operating or both operating at the same time. The preset threshold value may be a critical value of the load current of the first row transistor column 112. When the output signal of the first row transistor column 112 exceeds the preset threshold value for a long time, the temperature of the first row transistor column 112 will rise quickly. The designer can select the preset threshold value based on the actual setting parameters of the first row transistor column 112. Of course, the display panel 100 may also detect the output signal of the first row transistor column 112 by other means, which will be illustrated in the next embodiment and so will not be described here. The timing control signal can be output by the timing controller in the display panel 100, and the specific design is not to be described in detail here.

Figure 2:
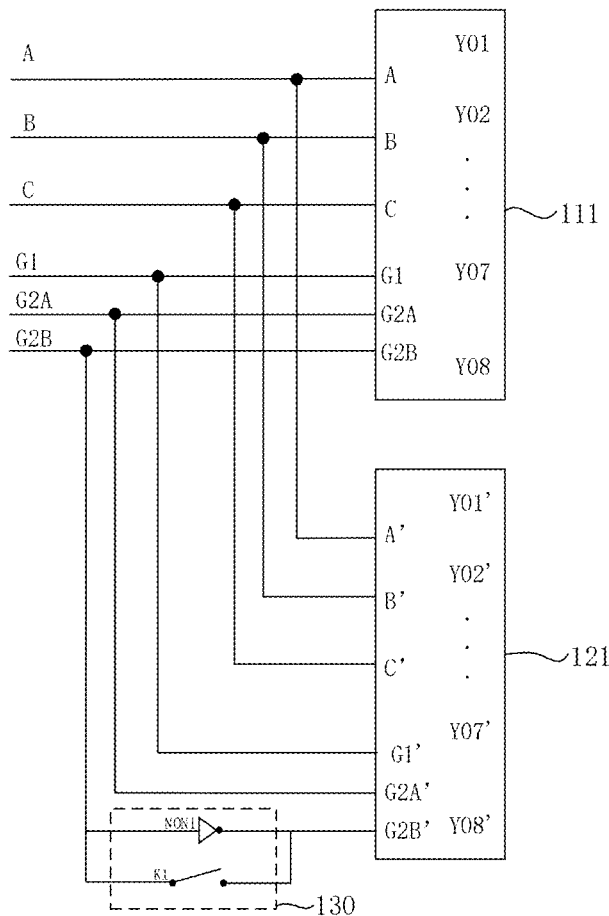
FIG. 2 is a schematic diagram illustrating a connection between a first decoder and a second decoder according to the first embodiment of the present application.

Specifically, as shown in FIG. 2, the control module 130 includes a switch K1. The first decoder 111 includes multiple first enable pins. The first enable pins include G1, G2A, and G2B. The second decoder 121 includes multiple second enable pins. The second enable pins include G1', G2A', and G2B'. One end of the switch K1 is connected to one of the first enable pins G1, G2A, and G2B, and the other end is connected to a corresponding one of the second enable pins G1', G2A', and G2B', for controlling the operation of the first decoder 111 and the second decoder 121. When the display panel 100 requires one of the first decoder 111 and the second decoder 121 to operate, the switch K1 is in a disconnected state. In this case, the first decoder 111 and the second decoder 121 are not connected, that is, the enable signal input to the first decoder 111 cannot be input to the second decoder 121, and the first decoder 111 is in an operating state alone. When the display panel 100 requires the first decoder 111 and the second decoder 121 to operate simultaneously, the switch K1 is in a conducting state. In this case, the first decoder 111 and the second decoder 121 are connected, and the enable signal input to the first decoder 111 can also be input to the second decoder 121, so that the first decoder 111 and the second decoder 121 operate simultaneously. By controlling the switch K1 to be in a disconnected state or a conducting state, the user can control one of the first decoder 111 and the second decoder 121 to operate or both to operate at the same time according to the actual parameter settings of the display panel 100. When one of them is operating, the other decoder that is not operating may be a standby decoder. When an operating decoder fails, the decoder can be replaced to extend the service life of the display panel 100. When both decoders are operating simultaneously, the high temperature heat source in the display panel 100 can be dispersed to the first row transistor column 112 and the second row transistor column 122. Compared with operating with a single decoder and a single row transistor, the high temperature heat source value in the local area of the display panel 100 is reduced, thereby improving the service life of the row transistor and the LED light-emitting elements, thereby extending the service life of the display panel 100.

Figure 3:
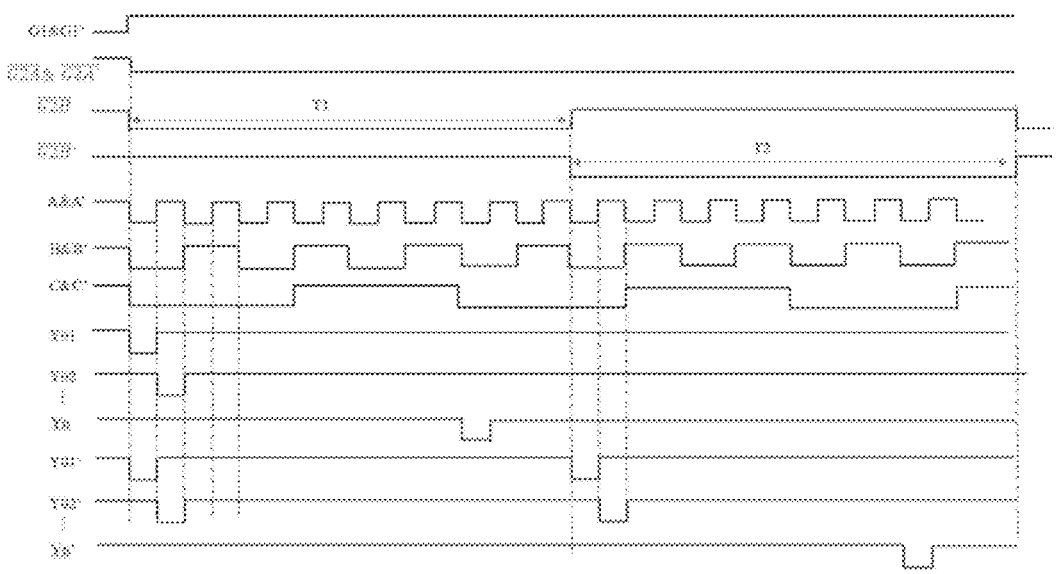
FIG. 3 is a schematic diagram illustrating a timing of the first decoder and the second decoder operating alternately according to the first embodiment of the present application.

Furthermore, in order to make full use of the first decoder 111 and the second decoder 121, the control module 130 further includes an inverter NON1. One end of the inverter NON1 is connected to one of the first enable pins G1, G2A, G2B, and the other end is connected to a corresponding one of the second enable pins G1', G2A', G2B'. The inverter NON1 is arranged in parallel with the switch K1. That is, one end of the inverter NON1 is connected to a first enable pin, and the other end is connected to a second enable pin, so that when the first decoder 111 receives a low-level voltage signal, the second decoder 121 can receive a high-level voltage signal through the inverter NON1. Conversely, when the first decoder 111 receives a high-level signal, the second decoder 121 can receive a low-level signal through the inverter NON1. When one of the first decoder 111 and the second decoder 121 is working, that is, the switch K1 is in the disconnected state, then the inverter NON1 is connected between the first decoder 111 and the second decoder 121. The first decoder 111 and the second decoder 121 can be alternately used by controlling the timing control signal input to the first decoder 111 in combination with the inverter NON1. The timing diagram is shown in FIG. 3. Compared with using only the first decoder 111, the alternating use of the first decoder 111 and the second decoder 121 can disperse the high-temperature heat source in the display panel 100 to the first row transistor column 112 and the second row transistor column 122, thereby improving the service life of the row transistor and the LED light-emitting elements, and thus extending the service life of the display panel 100. Furthermore, the inverter NON1 and the switch K1 are connected in parallel. When the switch K1 is closed, the inverter NON1 is short-circuited, so that the first decoder 111 and the second decoder 121 receive the same timing control signal to achieve simultaneous operation. At the same time, the first decoder 111 and the second decoder 121 can also be used as backup for each other through the inverter NON1. When the first decoder 111 fails, the second decoder 121 can be driven to operate by controlling the voltage signal input to the first decoder 111, so that when the first decoder 111 fails, the second decoder 121 can continue to work, thereby maintaining the normal display of the display panel 100.

In this embodiment, the first row transistor column 112 includes a plurality of first field effect transistors, and the second row transistor column 122 includes a plurality of second field effect transistors. The number of the first field effect transistors is equal to the number of the second field effect transistors. The plurality of first field effect transistors are arranged in one-to-one correspondence with the plurality of second field effect transistors. The first field effect transistor and the second field effect transistor are both PMOS transistor or NMOS transistor. When the anodes of the plurality of LED light-emitting elements are connected together, the first field effect transistor and the second field effect transistor are each implemented using the PMOS transistor. When the cathodes of the plurality of LED light-emitting elements are connected together, the first field effect transistor and the second field effect transistor are each implemented using the NMOS transistor. The display panel 100 further includes a signal enhancement module 160. The signal enhancement module 160 is connected to the first decoder 111 and the second decoder 121, and is used to enhance the signal input to the first decoder 111 and the second decoder 121, so that when the timing control signal is input to the first decoder 111 or the second decoder 121, the signal will not be distorted or weakened due to line transmission loss. In this embodiment, the signal enhancement module 160 is a 245 chip.

Figure 4:
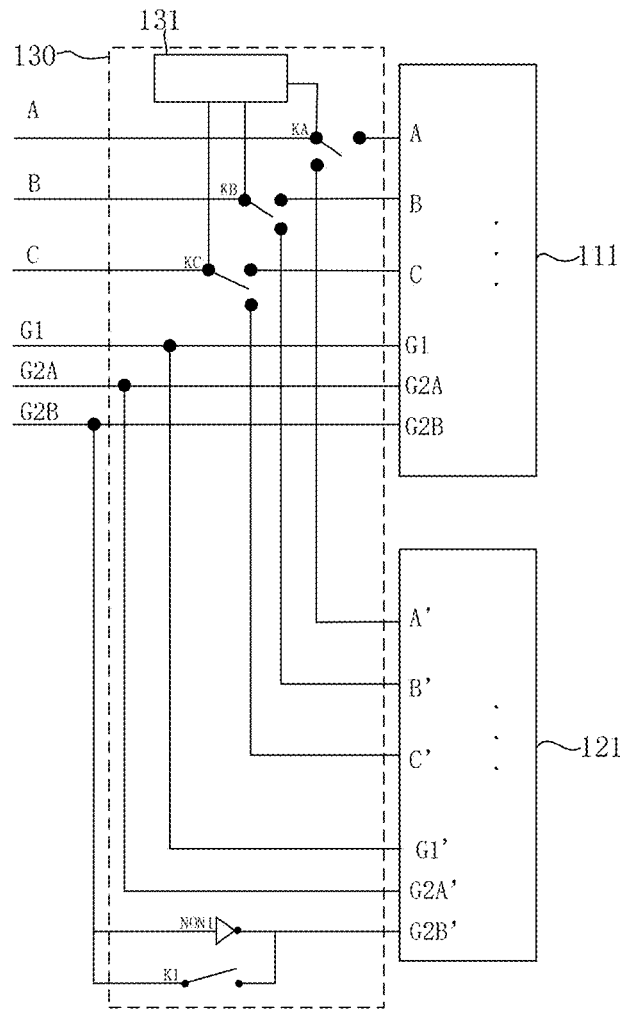
FIG. 4 is a schematic diagram illustrating the connection between the first decoder and the second decoder according to a second embodiment of the present application.

As shown in FIG. 4, as a second embodiment of the present application, which is a further improvement of the first embodiment of the present application, a display panel 100 is disclosed. The control module 130 further includes a control unit 131 and a control switch. The first decoder 111 includes multiple first input pins and multiple first output pins. The multiple first input pins include A, B, C. The multiple first output pins include Y01, Y02 . . . . Y08, etc. The second decoder 121 includes multiple second input pins and multiple second output pins. The multiple second input pins include A', B', C'. The multiple second output pins include Y01', Y02' . . . . Y08'. The input terminal of the control switch is connected to the control unit 131, and the output terminal of the control switch is connected to the first input pin or the second input pin. The control unit 131 switches to connect with the first decoder 111 or the second decoder 121 through the control switch. The first input pins and the second input pins receive driving signals for driving the first decoder 111 and the second decoder 121. After being processed by the first decoder 111 and the second decoder 121, the signals are output to the first row transistor column 112 and the second row transistor column 122 through the first output pins and the second output pins to control the operating state of the first row transistor column 112 and the second row transistor column 122.

When the display panel 100 of this embodiment is in use, it may work in a closed state of the switching circuit. The first decoder 111 and the second decoder 121 can receive the enable signal through the first enable pins or the second enable pins to work. When the control unit 131 switches to connect with the first decoder 111 through the control switch, the driving signal is input to the first decoder 111 through the first input pins. After being processed by the first decoder 111, the driving signal is output to the first row transistor column 112 through the first output pins to control the operating state of the first row transistor column 112. On the contrary, when the control unit 131 switches to connect with the second decoder 121 through the control switch, the driving signal is input to the second decoder 121 through the second input pins. After being processed by the second decoder 121, the driving signal is input to the second row transistor column 122 through the second output pins to control the operating state of the first row transistor column 112. The control unit 131 can be switched to be connected to the first decoder 111 or to be connected to the second decoder 121 through the control switch, so as to realize that the first row transistor column 112 drives the LED light-emitting element or the second row transistor column 122 drives the LED light-emitting element. That is, the display panel 100 of the present application can control the control switch by controlling the control signal output by the control unit 131 to realize the alternating operation of the first decoder 111 and the second decoder 121, so as to disperse the high temperature heat source in the display panel 100 to the first row transistor column 112 and the second row transistor column 122 thus reducing the high temperature heat source value, thereby improving the service life of the row transistor and the LED light-emitting element, and thus extending the service life of the display panel 100.

Specifically, as shown in FIG. 4, there is disposed a plurality of the first output pins. The first output pins include Y01, Y02, Y08, etc. There is disposed a plurality of the second output pins. The second output pins include Y01', Y02', Y08'. The first input pins of the first decoder 111 include A, B, C. The second input pins of the second decoder 121 include A', B', C'. The control switches include KA, KB, KC. When the control switches KA, KB, KC are in a first state, the control switches are connected to the first input pins of the first decoder 111. The first decoder 111 receives the driving signal through the first input pins, and then outputs it to the corresponding first field effect transistors in the first row transistor column 112 according to the first output pins Y01, Y02, etc. of the first decoder 111, so as to drive the LED light-emitting elements in the corresponding row. When the control switches KA and KB are in a second state, the control switches are connected to the second input pins of the second decoder 121. The second decoder 121 receives the driving signal through the second input pins, and then outputs it to the corresponding second field effect transistors in the second row transistor column 122 according to the second output pins Y01', Y02', etc. of the second decoder 121, so as to drive the LED light-emitting element in the corresponding row. The control switches are controlled to enter the first state or the second state by the control unit 131 to control the LED light-emitting elements to be driven by the first row driving module 110 or controlled by the second row driving module 120, thereby realizing the alternating operation of the first row driving module 110 and the second row driving module 120. If a single row driving module fails, the other row driving module can also continue to work, thereby realizing backup. It should be noted that the number of the first output pins is equal to the number of the first field effect transistors in the first row transistor column 112, and the number of the second output pins is equal to the number of the second field effect transistors in the second row transistor column 122.

Figure 5:
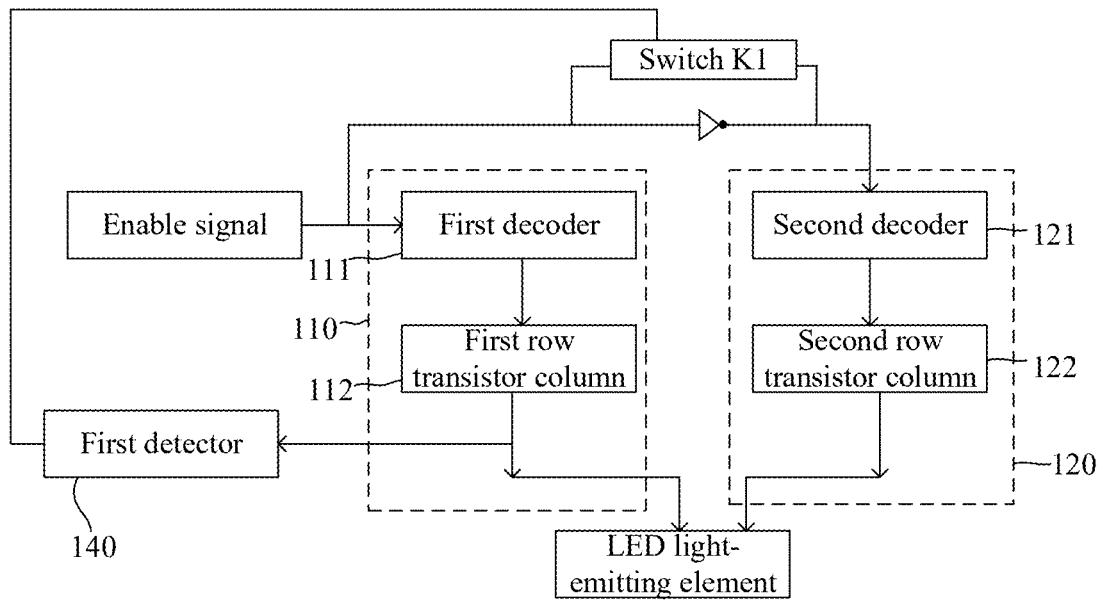
FIG. 5 is a schematic diagram illustrating the structure of a display panel including a first detection module according to the second embodiment of the present application.

Further, as shown in FIG. 5, the display panel 100 further includes a first detection module 140. The first detection module 140 is connected to the first row transistor column 112 and the switch K1 to detect the output signal of the first pin. When the output signal of the first pin is abnormal, the first detection module 140 controls the switch K1 to be turned on. At this time, the first decoder 111 and the second decoder 121 are connected, and the enable signal input to the first decoder 111 can also be input to the second decoder 121, so that the first decoder 111 and the second decoder 121 are both in an operating state. Then, the position of the first pin whose output signal is abnormal is determined, and the position of the corresponding faulty first field effect transistor is obtained, thereby determining the position of the corresponding first output pin, for example, Y02. When the first row transistor column 112 outputs a signal to the LED light-emitting elements of this row again through the first pin, the control switches KA, KB, and KC are controlled to be in the second state. At this time, the control switches are connected to the second input pins of the second decoder 121. The second decoder 121 receives the driving signal through the second input pins, and then outputs it to the second field effect transistors corresponding to the second row transistor column 122 according to the second output pins Y02' of the second decoder 121, and then outputs the signal to the LED light-emitting elements of the row through the second pins. On the contrary, if the output of the second field effect transistors in the second row transistor column 122 fails, the output operation can also be performed through the first field effect transistors of the first row transistor column 112, which does not affect the normal display of the display panel 100. When one of the first row transistor column 112 or the second row transistor column 122 has an output abnormality, the other first row transistor column 112 or the second row transistor column 122 that has no output abnormality can continue to work, so that the first row transistor column 112 and the second row transistor column 122 can have a complementary output function, extending the service life of the display panel 100. If the first detection module 140 detects that the output signal of the first pins is abnormal, it can be determined whether the output signal of the first pins is a exceeding-preset-threshold-value abnormality or is a faulty output abnormality. If it an exceeding-preset-threshold-value abnormality, then the switch K1 is directly controlled to be turned on, so that the first decoder 111 and the second decoder 121 are connected, and the first decoder 111 and the second decoder 121 work together, so that the first row transistor column 112 and the second row transistor column 122 jointly drive the LED light-emitting elements to operate. If it is a faulty output abnormality, then as mentioned above, another normally working row transistor needs to perform backup operation to maintain the normal display of the display panel 100. It should be noted that the first detection module 140 can perform detection and judgement by detecting the output current of the first row transistor column 112. The first detection module 140 may not only be set in the first row transistor column 112, but may be set in the second row transistor column 122 to detect the output signal of the second row transistor column 122.

Figure 6:
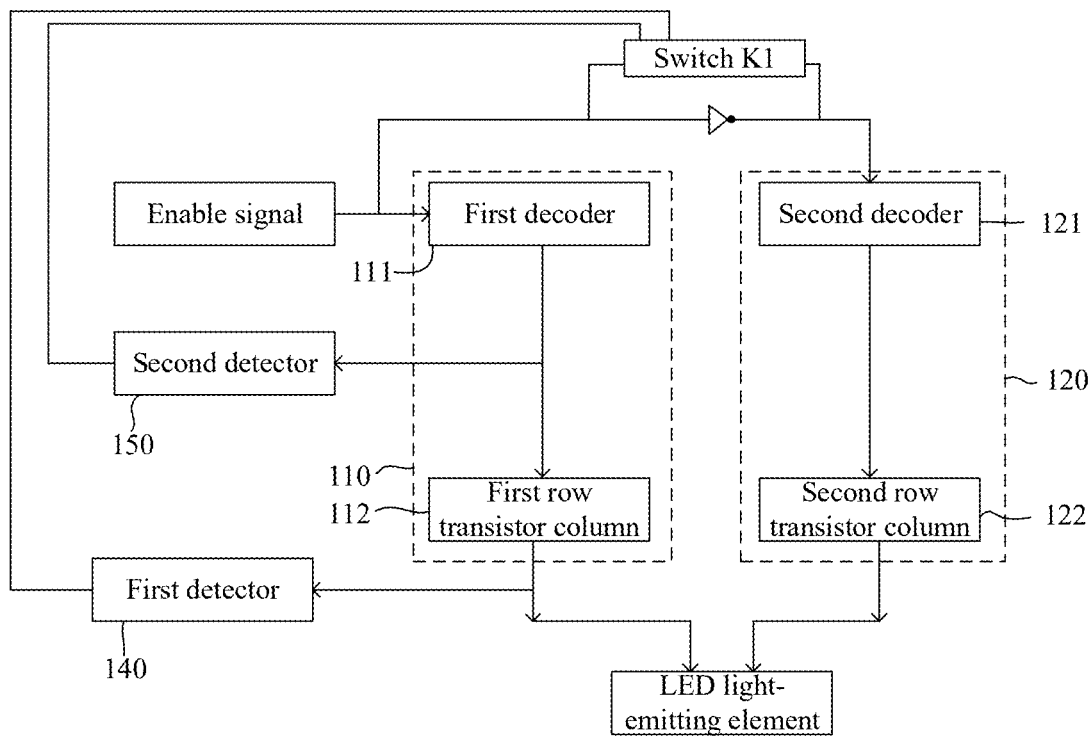
FIG. 6 is a schematic diagram illustrating the structure of a display panel including a second detection module according to the second embodiment of the present application.

Further, as shown in FIG. 6, the display panel 100 further includes a second detection module 150. The second detection module 150 is connected to the first decoder 111 and the switch K1 to detect the output signal of the first decoder 111. When the output signal of the first decoder 111 is abnormal, the second detection module 150 determines that the first decoder 111 is faulty. In this case, the second detection module 150 controls the switch K1 to be turned on so that the second decoder 121 receives the enable signal, thereby driving the display panel 100 through the second decoder 121 and the second row transistor column 122. Of course, the second detection module 150 may also be connected to the second decoder 121 to detect the output signal of the second decoder 121 to determine whether the second decoder 121 is faulty. The second detection module 150 may detect whether the output signal of the first decoder 111 or the second decoder 121 is abnormal. If an abnormality is found, another normally working decoder can be used for replacement to extend the service life of the display panel 100.

When the display panel 100 of this embodiment is in use, if it is detected that the output signal of the first row transistor column 112 exceeds the preset threshold value, it can be known that the driving capability of the first row transistor column 112 is insufficient. In this case, the first decoder 111 and the second decoder 121 may be made to work together by closing the switch, so that the first row transistor column 112 and the second row transistor column 122 can work together, and the heat originally gathered in the first row transistor column 112 due to operation is dispersed to the first row transistor column 112 and the second row transistor column 122, so that the heat is dispersed to extend the service life of the display panel 100. Furthermore, the first decoder 111 and the second decoder 121 may also be made to work alternately through the inverter NON1. Compared with the solution of using only the first row transistor column 112 to work, the alternating operation of the first row transistor column 112 and the second row transistor column 122 can disperse the heat to the first row transistor column 112 and the second row transistor column 122, and will not increase the energy consumption of the display panel 100. When the first row transistor column 112 is in the operating state, the second row transistor column 122 does not operate, and its operating timing diagram is shown in FIG. 3, thereby achieving heat dispersion without increasing the energy consumption of the display panel 100 and extending the service life of the display panel 100. In addition, the display panel 100 of the present application further includes a first detection module 140 and a second detection module 150. The first detection module 140 can detect whether the output signal of the row transistor is abnormal. When one of the first row transistor column 112 or the second row transistor column 122 has an output abnormality, the other first row transistor column 112 or the second row transistor column 122 that has no output abnormality can continue to work, so that the first row transistor column 112 and the second row transistor column 122 can have a complementary output function, extending the service life of the display panel 100. The second detection module 150 detects whether the output signal of the first decoder 111 or the second decoder 121 is abnormal. If there is an abnormality, another decoder that works normally can be used for replacement to extend the service life of the display panel 100. The display panel 100 of the present application can not only disperse the high-temperature heat source in the display panel 100 and reduce the high-temperature heat source value, thereby improving the service life of the row transistor and the LED light-emitting element, but also allow the first row transistor column 112, the second row transistor column 122, the first decoder 111, and the second decoder 121 in the display panel 100 to serve as backup for each other. When the row transistor or decoder fails, the backup row transistor and decoder can be called to work, thereby improving the use flexibility of the display panel 100, maintaining the normal display of the display panel 100, and thus extending the service life of the display panel 100, thereby eliminating the need for maintenance and replacement, saving labor costs.

Figure 7:
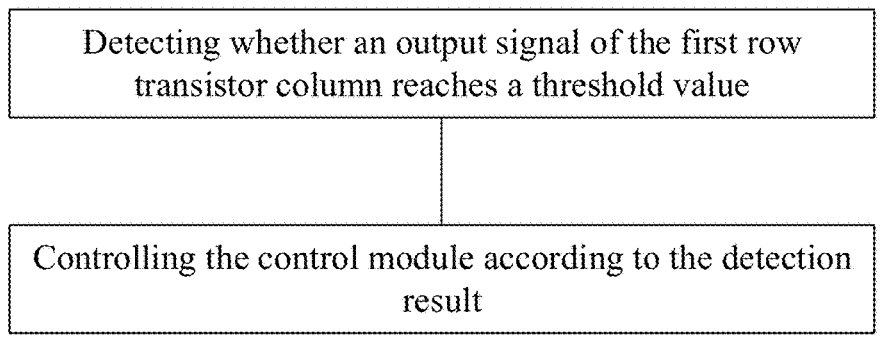
FIG. 7 is a flowchart of a driving method of a display panel according to a third embodiment of the present application.

As shown in FIG. 7, a third embodiment of the present application discloses a display panel driving method, which is applied to the display panel described above, and includes the following operations:

detecting whether an output signal of the first row transistor column reaches a threshold value; and controlling the control module according to the detection result;

when the detection result reaches the threshold value, the control module 130 controlling the first decoder 111 and the second decoder 121 to work simultaneously; when the detection result does not reach the threshold value, the control module 130 controlling one of the first decoder 111 and the second decoder 121 to work. The display panel 100 can detect whether the output signal of the first row transistor column 112 reaches the threshold value, and decide to let whether one of the first row transistor column 112 and the second row transistor column 122 work or let both work together, so that the operating temperature of the display panel 100 can be stably controlled during operation, avoiding the problem of temperature rise of the display panel 100 due to the use of a single row transistor, which may affect the light-emitting efficiency and causes color temperature deviation of the LED light-emitting elements. Thus, the high-temperature heat source in the display panel 100 is dispersed and the high-temperature heat source value is reduced, thereby improving the service life of the row transistor and the LED light-emitting elements, and thus extending the service life of the display panel 100.

Figure 8:
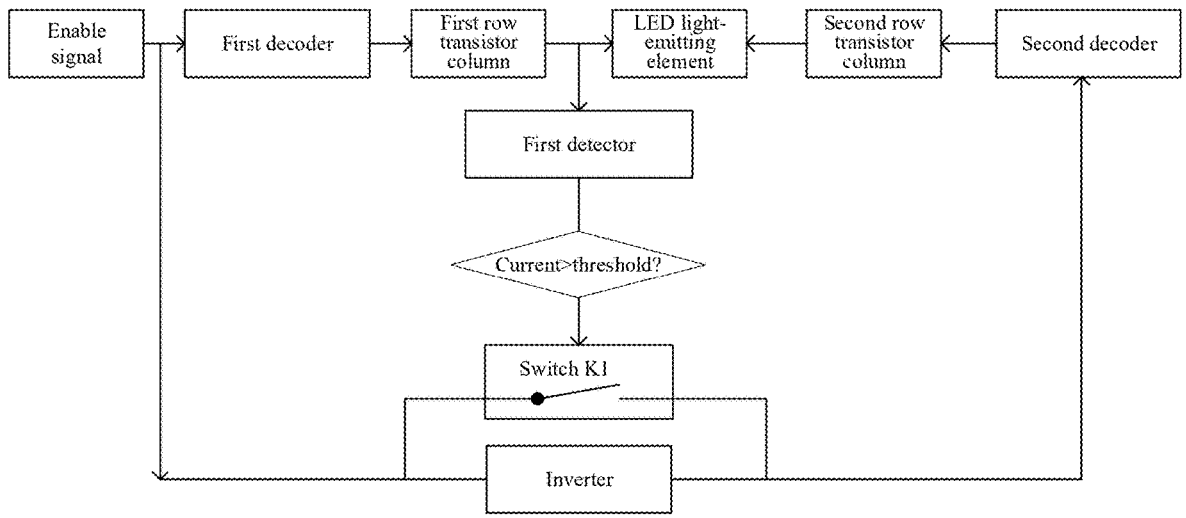
FIG. 8 is a flowchart illustrating a workflow of the display panel according to the third embodiment of the present application.

Further, the operation of controlling the control module according to the detection result includes:

when the detection result is greater than the threshold value, the control module controlling the switch to be closed, so that the first decoder and the second decoder operate at the same time; until the detection result is less than the threshold value, the control module controlling the switch to be opened, so that one of the first decoder and the second decoder works; the threshold value may be a rated value of the first row transistor column, or if the second row transistor column is detected, the threshold value is the rated value of the second row transistor column; wherein, the working flow diagram of the display panel is shown in FIG. 8.

Specifically, when in use, the timing control signal is input into the first decoder 111. After being processed by the first decoder 111, the first decoder 111 controls the first row transistor column 112 to control the plurality of LED light-emitting elements to work and emit light. The first detection module 140 detects the output signal of the first row transistor column 112. When the detection result is greater than the threshold value, that is, it is detected that the output current of the first row transistor column 112 is greater than the rated value of the first row transistor column 112, then in this case, the control module 130 closes the switch K1, so that the first decoder 111 and the second decoder 121 work together. As such, the heat originally accumulated in the first row transistor column 112 due to operation is dispersed to the first row transistor column 112 and the second row transistor column 122, avoiding the heat from being accumulated on one side for a long time, thereby improving the display effect, and realizing heat dispersion to extend the service life of the display panel 100, avoiding the long-term overload operation of a single group of row transistors affecting the service life, and improving reliability of using the display panel 100. During this process, when the first detection module 140 detects that the output signal of the first row transistor column 112 is less than the rated value of the first row transistor column 112 for a period of time, that is, when the detection result is less than the threshold value, the control module 130 disconnects the switch K1, so that the first decoder 111 and the second decoder 121 realize the alternating operation of the first decoder 111 and the second decoder 121 through the inverter NON1, thereby avoiding the long-term single operation of the first row transistor column 112 and the second row transistor column 122, which causes a certain local temperature rise thereby affecting the display effect and then affecting the overall display effect of the display panel. At the same time, the alternating operation of the first row transistor column 112 and the second row transistor column 122 can also improve the service life of the first row transistor column 112 and the second row transistor column 122, thereby improving the overall reliability and service life of the display panel 100.

Figure 9:
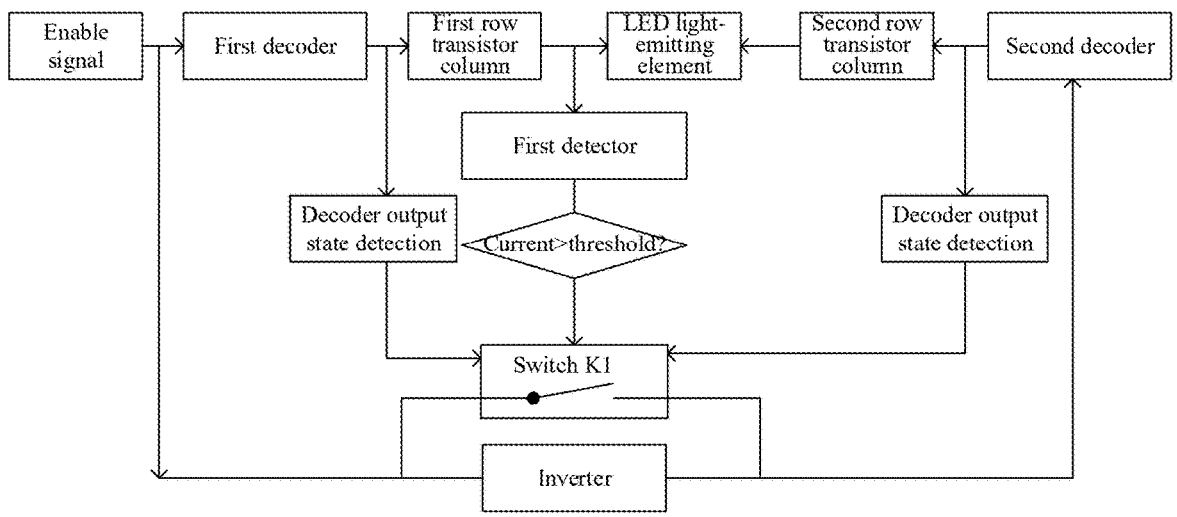
FIG. 9 is another flowchart illustrating the workflow of the display panel according to the third embodiment of the present application.

Furthermore, the first detection module may also detect that the output signal of the first row transistor column is zero. When the detection result is continuously zero, it is determined that the first decoder is abnormal. It may be that an output pin in the first decoder is abnormal, causing the corresponding output signal of the first row transistor column to be zero, or it may be other reasons that cause the first decoder to not work properly. At this time, the control module closes the switch so that the first decoder and the second decoder can work together to keep a set of decoder and row transistor working normally. The control switch is used to switch between the first row transistor column controlling the LED light-emitting elements to emit light or the second row transistor column controlling the LED light-emitting elements to emit light, so that when an abnormality occurs in the first row transistor column, the second decoder and the second row transistor column can be used to control the LED light-emitting elements to emit light, so that the display panel can keep the screen displaying normally. The workflow diagram of the display panel is shown in FIG. 9.

Specifically, when the first detection module 140 detects that the output signal of a first pin of the first row transistor column 112 is zero, and the second detection module 150 detects that the output signal of the first decoder 111 is abnormal, it is determined that the first output pin of the first decoder 111 is a faulty output, and the corresponding first pin in the first row transistor column 112 outputs zero. At this time, when it is required to drive the LED light-emitting elements corresponding to the first pin of the first row transistor column 112, the switch K1 can be closed, and the control switches KA, KB, and KC are switched to the second decoder 121 and the second row transistor column 122 to drive the LED light-emitting elements of this row to emit light, so as to maintain the normal display of the display panel 100. When the LED light-emitting elements of the next row needs to be driven, the control switches KA, KB, and KC are switched to the first decoder 111 and the first row transistor column 112 to operate, and the switch K1 is disconnected, so that the first decoder 111 and the first row transistor column 112 continue to drive the LED light-emitting elements to emit light. By switching the switch K1 and the control switches KA, KB, and KC, the first decoder 111, the second decoder 121, the first row transistor column 112, and the second row transistor column 122 can realize mutual backup for each other. When one of the first row transistor column 112 and the second row transistor column 122 or one of the first decoder 111 and the second decoder 121 is abnormal, the display panel 100 can operate through another normal device to make the image display normally.

When the first detection module 140 detects that the output signal of a first pin of the first row transistor column 112 is zero, and the second detection module 150 detects that the output signal of the first decoder 111 is normal, it is determined that the output pin of the first decoder 111 is working normally, and it is determined that the first decoder 111 cannot work normally due to other reasons. At this time, the control module 130 closes the switch K1, so that the first decoder 111 and the second decoder 121 work together, thereby ensuring that at least one of the first decoder 111 and the second decoder 121 can output a normal signal to drive the LED light-emitting elements, so that when one of the first row transistor column 112 and the second row transistor column 122 or one of the first decoder 111 and the second decoder 121 is abnormal, the display panel 100 can operate through another normal device to display the image normally.

That is, the control module is controlled according to the detection result. When the detection result is continuously zero, it is determined that the first decoder is abnormal, and the output signal of the first decoder is detected. When the detection result of the output signal of the first decoder is abnormal, it is determined that the first decoder is abnormal. The control module controls the switch to be closed, and the control switch switches to connect with the second decoder, so that the second decoder operates. When the detection result of the output signal of the first decoder is normal, it is determined that the first decoder is normal, the control module controls the switch to be closed, so that the first decoder and the second decoder operate simultaneously.

Figure 10:
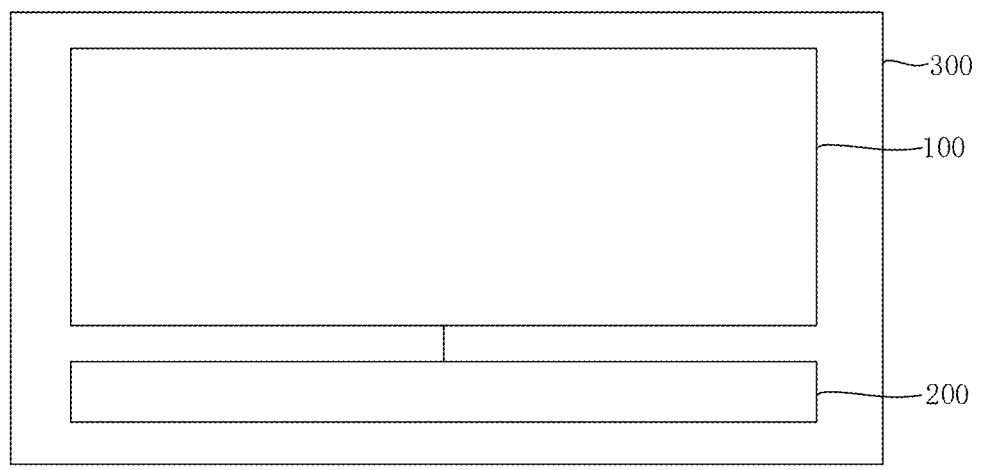
FIG. 10 is a schematic diagram illustrating the structure of a display device according to a fourth embodiment of the present application.

As shown in FIG. 10, as a fourth embodiment of the present application, a display device 300 is disclosed. The display device 300 includes a driving circuit 200 and a display panel 100 as described in the foregoing embodiments. The driving circuit 200 is configured to drive the display panel 100. The display device 300 of this embodiment can detect whether the output signal of the first row transistor column 112 reaches the threshold value, and decide to let one of the first row transistor column 112 and the second row transistor column 122 operate or let both operate together. Thereby, the operating temperature of the display panel 100 can be stably controlled during operation, avoiding the problem of the temperature rise of the display panel 100 caused by the use of a single row transistor, which may affect the light-emitting efficiency and cause color temperature shift of the LED light-emitting elements. Furthermore, the high-temperature heat source in the display panel 100 is dispersed and the high-temperature heat source value is reduced, thereby improving the service life of the row transistor and the LED light-emitting element, and thus extending the service life of the display panel 100.

It should be noted that the limitations of various operations involved in this solution will not be deemed to limit the order of the operations, provided that they do not affect the implementation of the specific solution, so that the operations written earlier may be executed earlier or they may also be executed later or even at the same time. As long as the solution can be implemented, they should all be regarded as falling in the scope of protection of this application.

The technical solutions of the present application can be widely used in various display panels, such as TN (Twisted Nematic) display panels, IPS (In-Plane Switching) display panels, VA (Vertical Alignment) display panels, and MVA (Multi-Domain Vertical Alignment) display panels panel. Of course, other types of display panels, such as OLED (Organic Light-Emitting Diode) display panels, may also be applicable to the above solutions.

It should be noted that the inventive concept of the present application can be formed into many embodiments, but the length of the application document is limited and so these embodiments cannot be enumerated one by one. The technical features can be arbitrarily combined to form a new embodiment, and the original technical effect may be enhanced after the various embodiments or technical features are combined.

The foregoing description is merely a further detailed description of the present application with reference to some specific illustrative embodiments, and the specific implementations of the present application are not to be construed to be limited to these illustrative embodiments. For those having ordinary skill in the technical field to which this application pertains, numerous simple deductions or substitutions may be made without departing from the concept of this application, which shall all be regarded as falling in the scope of protection of this application.

What is claimed is:

1. A display panel, comprising:
    a base plate;
    a plurality of LED light-emitting elements arranged in an array on the base plate;
    a first row driving module, arranged on one side of the base plate, comprising a first row transistor column and a first decoder connected to the first row transistor column, wherein the first row transistor column comprises a plurality of first pins, each of which is connected to a respective row of the LED light-emitting elements;
    a second row driving module, arranged on another side of the base plate, comprising a second row transistor column and a second decoder connected to the second row transistor column, wherein the second row transistor column comprises a plurality of second pins, each of which is connected to a respective row of the LED light-emitting elements, wherein one side of each row of LED light-emitting elements is connected to the respective first pin of the first row transistor column, and another side is connected to the respective second pin of the second row transistor column, so that the plurality of LED light-emitting elements are operative to be driven by the first row transistor column and the second row transistor column individually or in conjunction; and
    a control module, connected to the first row driving module and the second row driving module;
    wherein the control module comprises a switch and is configured to detect whether an output signal of the first row transistor column reaches a threshold value; the first decoder comprises a first enable pin, the second decoder comprises a second enable pin; one end of the switch is connected to the first enable pin, and another end of the switch is connected to the second enable pin for controlling an operation of the first decoder and the second decoder;
    the first decoder and the second decoder are not connected when the switch is in a disconnected state in response to the output signal reaching the threshold value, so that one of the first decoder and the second decoder operates; and the first decoder and the second decoder are connected when the switch is in a conducting state in response to the output signal not reaching the threshold value, so that the first decoder and the second decoder operate simultaneously.

2. The display panel as recited in claim 1, wherein the control module further comprises an inverter, wherein one end of the inverter is connected to the first enable pin, and another end is connected to the second enable pin, wherein the inverter is connected in parallel with the switch.

3. The display panel as recited in claim 1, wherein the control module further comprises a control unit and a control switch, wherein the first decoder comprises at least one first input pin and at least one first output pin, wherein the second decoder comprises at least one second input pin and at least one second output pin; wherein an input terminal of the control switch is connected to the control unit, an output terminal of the control switch is connected to the at least one first input pin or the at least one second input pin; wherein the at least one first output pin is connected to the respective first row transistor column, wherein the at least one second output pin is connected to the respective second row transistor column; wherein the control unit is operative to switch to connect to the first decoder or connect to the second decoder through the control switch.

4. The display panel as recited in claim 3, further comprising a first detection module that is connected to the first row transistor column and the switch and that is used to detect an output signal of the plurality of first pins; wherein in response to the output signal of the plurality of first pins becoming abnormal, the first detection module is configured to control the switch to be turned on.

5. The display panel as recited in claim 4, wherein the first detection module is operative to detect an output current of the first row transistor column to perform detection and judgment.

6. The display panel as recited in claim 3, further comprising a first detection module that is connected to the second row transistor column and the switch and that is used to detect an output signal of the plurality of second pins; wherein in response to the output signal of the plurality of second pins becoming abnormal, the first detection module is configured to control the switch to be turned on.

7. The display panel as recited in claim 1, further comprising a second detection module that is connected to the first decoder and the switch and that is used to detect an output signal of the first decoder; wherein in response to the output signal of the first decoder becoming abnormal, the second detection module is configured to control the switch to be turned on.

8. The display panel as recited in claim 1, the first row driving module and the second row driving module are respectively arranged on two sides of a plurality of LED light-emitting elements that are arranged in an array.

9. The display panel as recited in claim 1, wherein the first row transistor column comprises a plurality of first field effect transistors, wherein the second row transistor column comprises a plurality of second field effect transistors, wherein a number of the first field effect transistors is equal to a number of the second field effect transistors, and wherein the plurality of first field effect transistors are arranged in one-to-one correspondence with the plurality of second field effect transistors.

10. The display panel as recited in claim 9, wherein each of the plurality of first field effect transistors is a PMOS transistor or an NMOS transistor, each of the plurality of second field effect transistors is a PMOS transistor or an NMOS transistor; wherein when anodes of the plurality of LED light-emitting elements are connected together, each of the plurality of first field effect transistors is implemented using the PMOS transistor, and each of the plurality of second field effect transistors is implemented using the PMOS transistor; when cathodes of the plurality of LED light-emitting elements are connected together, each of the plurality of first field effect transistors is implemented using the NMOS transistor, and each of the plurality of second field effect transistors is implemented using the NMOS transistor.

11. The display panel as recited in claim 9, wherein a number of the first output pins is equal to a number of the first field effect transistors in the first row transistor column, wherein a number of the second output pins is equal to a number of the second field effect transistors in the second row transistor column.

12. The display panel as recited in claim 1, further comprising a signal enhancement module that is connected to the first decoder and the second decoder and that is used to enhance a signal input to the first decoder and the second decoder.

13. A method for driving a display panel, wherein the display panel comprises a base plate, a plurality of LED light-emitting elements, a first row driving module, a second row driving module, and a control module; wherein the plurality of LED light-emitting elements are arranged in an array on the base plate, wherein the first row driving module is arranged on one side of the base plate, wherein the first row driving module comprises a first row transistor column and a first decoder connected to the first row transistor column; wherein the first row transistor column comprises a plurality of first pins, each of which is connected to a respective row of the LED light-emitting elements; wherein the second row driving module is arranged on another side of the base plate, wherein the second row driving module comprises a second row transistor column and a second decoder connected to the second row transistor column; wherein the second row transistor column comprises a plurality of second pins, each of which is connected to a respective row of the LED light-emitting elements, wherein one side of each row of LED light-emitting elements is connected to the respective first pin of the first row transistor column, and another side is connected to the respective second pin of the second row transistor column, so that the plurality of LED light-emitting elements are operative to be driven by the first row transistor column and the second row transistor column individually or in conjunction; wherein the control module is connected to the first row driving module and the second row driving module, the control module comprises a switch; the first decoder comprises a first enable pin, the second decoder comprises a second enable pin; one end of the switch is connected to the first enable pin, and another end of the switch is connected to the second enable pin for controlling an operation of the first decoder and the second decoder;

wherein the driving method of the display panel comprises the following operations:

detecting whether an output signal of the first row transistor column reaches a threshold value; and controlling the control module according to a detection result;

wherein in response to the detection result reaching the threshold value, the switch is in a conducting state, the first decoder and the second decoder are connected, the control module is configured to control the first decoder and the second decoder to operate simultaneously; in response to the detection result not reaching the threshold value, the switch is in a disconnected state, the first decoder and the second decoder are not connected, the control module is configured to control one of the first decoder and the second decoder to operate.

14. The driving method as recited in claim 13, wherein the operation of controlling the control module according to the detection result comprises:

in response to the detection result being greater than the threshold value, controlling the switch to be closed by the control module so that the first decoder and the second decoder are operating simultaneously; until the detection result is less than the threshold value, controlling the switch to be turned off by the control module so that one of the first decoder and the second decoder is operating;

wherein the threshold value is a rated value of the first row transistor column.

15. The driving method as recited in claim 14, wherein the operation of controlling the control module according to the detection result comprises:

in response to the detection result continuously being zero, determining that the first decoder is operating abnormally, and controlling the switch to be closed by the control module so that the first decoder and the second decoder are operating simultaneously.

16. A display device, comprising a driving circuit and a display panel, wherein the display panel comprises:

a base plate;

a plurality of LED light-emitting elements arranged in an array on the base plate;

a first row driving module, arranged on one side of the base plate, comprising a first row transistor column and a first decoder connected to the first row transistor column, wherein the first row transistor column comprises a plurality of first pins, each of which is connected to a respective row of the LED light-emitting elements;

a second row driving module, arranged on another side of the base plate, comprising a second row transistor column and a second decoder connected to the second row transistor column, wherein the second row transistor column comprises a plurality of second pins, each of which is connected to a respective row of the LED light-emitting elements, wherein one side of each row of LED light-emitting elements is connected to the respective first pin of the first row transistor column, and another side is connected to the respective second pin of the second row transistor column, so that the plurality of LED light-emitting elements are operative to be driven by the first row transistor column and the second row transistor column individually or in conjunction; and a control module, connected to the first row driving module and the second row driving module, wherein the control module comprises a switch and is configured to detect whether an output signal of the first row transistor column reaches a threshold value; the first decoder comprises a first enable pin, the second decoder comprises a second enable pin; one end of the switch is connected to the first enable pin, and another end of the switch is connected to the second enable pin for controlling an operation of the first decoder and the second decoder;

the first decoder and the second decoder are not connected when the switch is in a disconnected state in response to the output signal reaching the threshold value, so that one of the first decoder and the second decoder operates; and the first decoder and the second decoder are connected when the switch is in a conducting state in response to the output signal not reaching the threshold value, so that the first decoder and the second decoder operate simultaneously;

wherein the driving circuit is configured to drive the display panel.

17. The display panel as recited in claim 16, wherein the control module further comprises an inverter, wherein one end of the inverter is connected to the first enable pin, and another end is connected to the second enable pin; wherein the inverter is connected in parallel with the switch.

18. The display panel as recited in claim 16, wherein the control module further comprises a control unit and a control switch, wherein the first decoder comprises at least one first input pin and at least one first output pin, wherein the second decoder comprises at least one second input pin and at least one second output pin, wherein an input terminal of the control switch is connected to the control unit, wherein an output terminal of the control switch is connected to the at least one first input pin or the at least one second input pin, wherein the at least one first output pin is connected to the first row transistor column, wherein the at least one second output pin is connected to the second row transistor column;

wherein the control unit is operative to switch to connect to the first decoder or to connect to the second decoder through the control switch.

* * * * *